United States Patent [19]
Satoh et al.

[11] Patent Number: 5,107,355
[45] Date of Patent: Apr. 21, 1992

[54] LIQUID CRYSTAL DISPLAY DEVICE HAVING LAYERED BUS LINE STRUCTURE

[75] Inventors: Taxay Satoh, Hino; Hiroshi Kobayashi, Hachioji, both of Tokyo, Japan

[73] Assignee: Konica Corporation, Tokyo, Japan

[21] Appl. No.: 478,558

[22] Filed: Feb. 12, 1990

[30] Foreign Application Priority Data

Feb. 13, 1989 [JP] Japan .................................. 1-31123

[51] Int. Cl.⁵ ................................................ G02F 1/13
[52] U.S. Cl. .......................................... 359/87; 359/54; 359/57; 359/58; 359/62; 340/784
[58] Field of Search ............... 350/334, 336, 333, 332, 350/339 R; 340/784

[56] References Cited

U.S. PATENT DOCUMENTS

| | | | |
|---|---|---|---|
| 4,523,811 | 6/1985 | Ota | 350/336 |
| 4,712,872 | 12/1987 | Kabe et al. | 350/333 |
| 4,828,370 | 5/1989 | Suzuki | 350/339 R |
| 4,869,576 | 9/1989 | Aoki et al. | 350/336 |
| 4,955,697 | 9/1990 | Tsukada et al. | 350/332 |

FOREIGN PATENT DOCUMENTS

| | | | |
|---|---|---|---|
| 58-33221 | 2/1983 | Japan | 350/339 R |
| 58-207025 | 12/1983 | Japan | 350/334 |
| 60-237429 | 11/1985 | Japan | 350/334 |
| 61-175624 | 8/1986 | Japan | 350/334 |
| 62-6221 | 1/1987 | Japan | 350/334 |
| 62-100735 | 5/1987 | Japan | 350/350 S |
| 62-100739 | 5/1987 | Japan | 350/331 R |
| 63-070282 | 2/1988 | Japan | 350/336 |
| 63-070281 | 3/1988 | Japan | 350/336 |
| 63-273837 | 11/1988 | Japan | 350/339 R |
| 1-120539 | 5/1989 | Japan | 350/336 |

OTHER PUBLICATIONS

Oki et al., "A New Active Matrix LCD Architecture for Larger Size Flat Display", SID, vol. 29/3, 1988, pp. 217-220.

Primary Examiner—Rolf Hille
Assistant Examiner—Minhloan Tran
Attorney, Agent, or Firm—Finnegan, Henderson, Farabow, Garrett and Dunner

[57] ABSTRACT

The invention provides a liquid crystal display device which includes a transparent substrate; transparent pixel electrodes arranged in the form of a matrix on the transparent substrate; active elements for switching the pixel electrodes, the active element provided to each of said pixel electrodes and having a laminated structure; and bus line provided among the pixel electrodes. The bus line includes a transparent conductive layer provided on the transparent substrate; a first wiring layer superimposed on the transparent conductive layer; and a second wiring layer superimposed on the first wiring layer. The second wiring layer has a branch portion which is extended from a position on the first wiring layer onto the transparent substrate, and the branch portion used as an electrode on the transparent substrate side in the laminated structure of the active element.

17 Claims, 5 Drawing Sheets

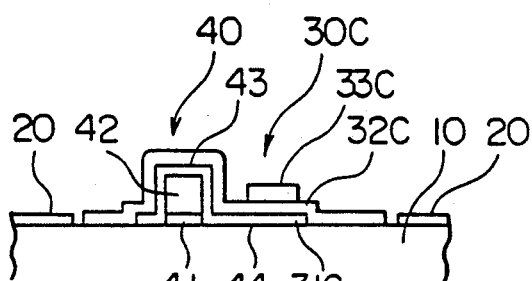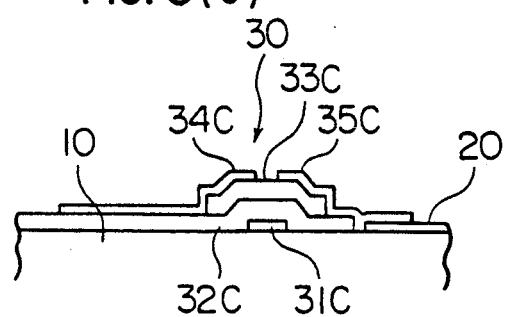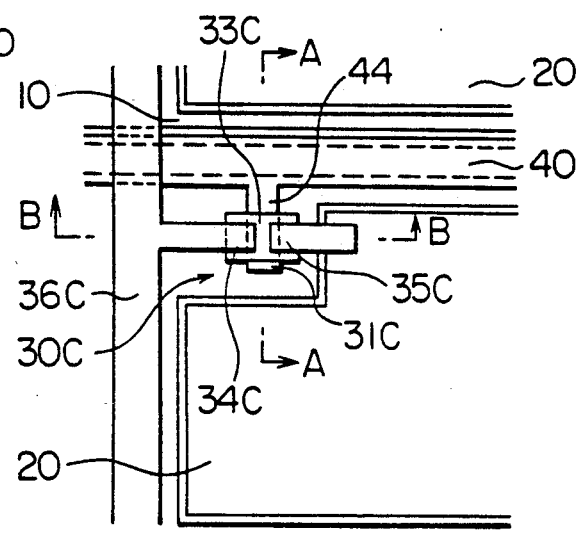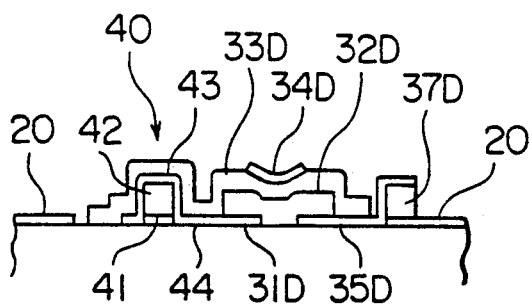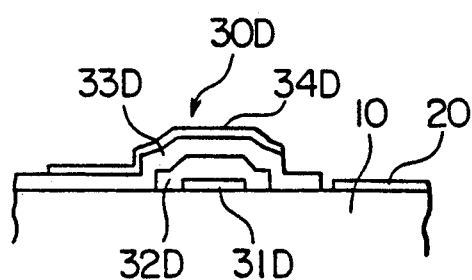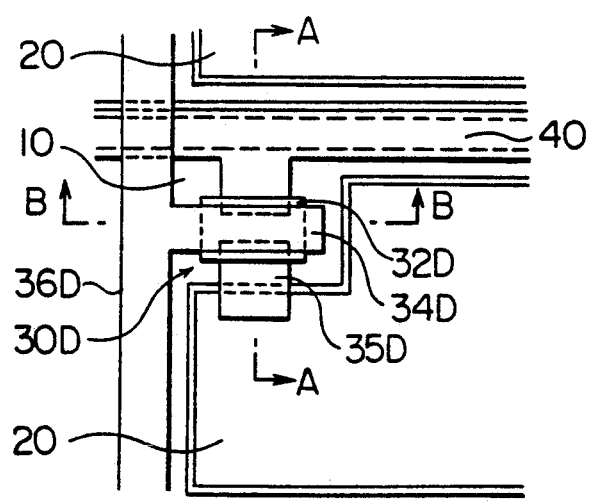

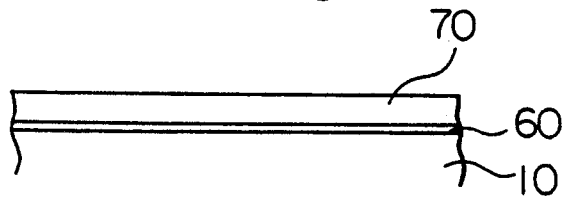
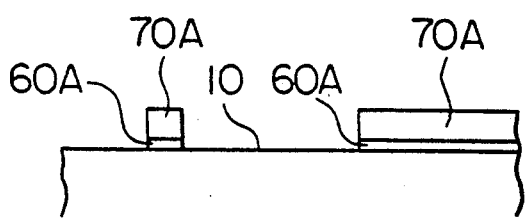
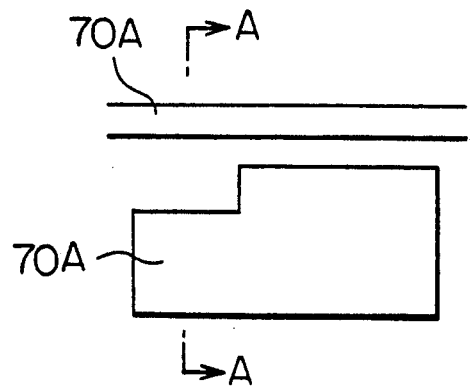
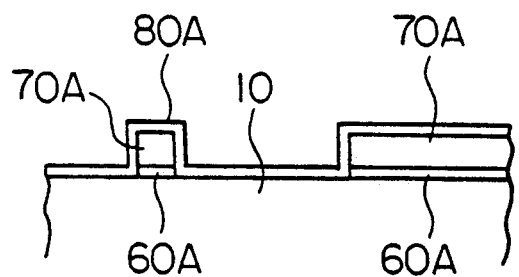
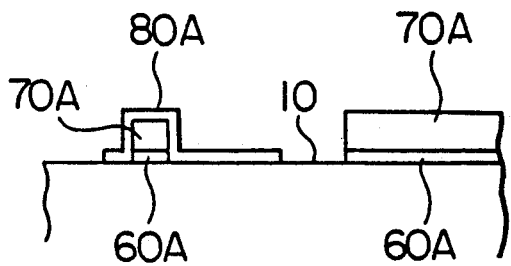
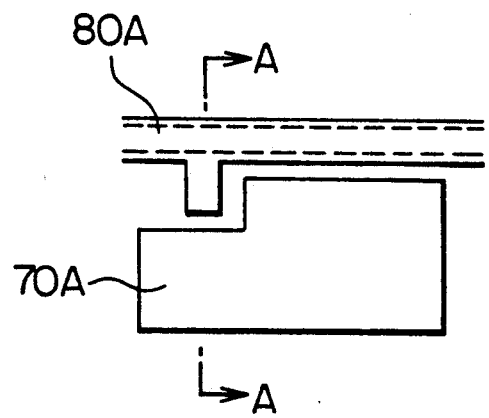

LIQUID CRYSTAL DISPLAY DEVICE HAVING LAYERED BUS LINE STRUCTURE

BACKGROUND OF THE INVENTION

This invention relates to a liquid crystal display device, and more particularly to a liquid crystal display device characterized by a structure composed of both a bus line and an active element by which each pixel electrode placed in the form of a matrix is switched on and off. Furthermore, this invention relates to the manufacturing method of the above-described liquid crystal display device.

Conventionally, a liquid crystal display device comprises a pixel electrode placed in the form of a matrix, a bus line and an active element for switching the pixel electrode.

Recently, there has been strong demand for a liquid crystal display device with a wide display screen composed of fine dots. In order to meet this requirement, the bus line necessarily becomes longer. Therefore, it is necessary to make the bus line from materials with low electrical resistance. Accordingly, it is necessary to form the thick layer bus line from materials with high conductivity.

Active elements are assembled in the form of a laminated structure. In order to increase the reliability of the active elements by preventing them from being damaged, it is preferable to form a laminated structure by covering the active elements on a condition where a level difference is eliminated as far as possible. For that reason, it is necessary to make the electrode layer on the transparent substrate side thin.

However, from the viewpoint of simplifying the manufacturing process, it is preferable that a portion of the bus line is used as the electrode of the active element on the transparent substrate side. In other words, a portion of the bus line which was made thick, a portion of the bus line which branches from the bus line to the active element side, or a position of the bus line itself is used as the active element electrode on the transparent substrate side. It is preferable that a branch of the bus line is used as the gate in the case of the reverse stagger TFT (thin-film transistor), and a branch of the bus line is used as the source in the case of the normal stagger TFT. Furthermore, it is preferable that a branch of the bus line is used as one of the electrodes in the case of MIM (metal insulator metal), and a branch of the bus line is used as the electrode to form a Schottky barrier in the case of a back to back Schottky diode.

However, the following are the problems caused when a portion of the bus line is used as the electrode of the active elements on the transparent substrate side.

(1) When a thick layer is used as the bus line in order to reduce electrical resistance to meet the requirements of a large and fine display unit, the electrode of the active elements on the transparent substrate side, which is a portion of the bus line, becomes a thick layer. As a result, a level difference on a covered condition in the laminated structure of the active elements becomes too large and then defects such as a short-circuit and a deterioration in withstanding voltage may increase. This leads to a decrease in the reliability of the active element.

(2) On the other hand, when a thin layer is used as the electrode on the transparent substrate side of the active elements is made a thin layer in order to accomplish no level difference on a covered condition, there is no alternative but to reduce the layer thickness of the bus line itself. As a result, the electrical resistance of the bus line increases and it becomes difficult to obtain a wide display screen composed of fine dots.

According to the circumstances described above, the following method was disclosed recently in Japanese Patent Publication Open to Public Inspection No. 070281/1988 and No. 070282/1988. In a liquid crystal display device in which reverse stagger TFT is used as an active element, a method of providing a bus line with a stepped formation and a gate electrode of a thin layer, comprises the steps of; forming on a transparent substrate a bus line for a gate and a gate electrode consisting of a branch of the bus line for the gate; forming a resistant layer on the transparent substrate including them; remaining a narrow resistant layer on the bus line for the gate by over-exposing the reverse side of the transparent substrate with a mask on the bus line and the gate electrode for self-alignment; and removing a prescribed amount from both the bare upper portion of the bus line for the gate and the upper portion of the gate electrode by the anisotropic dry etching method wherein the resistant layer is used as the mask.

According to the method described above, the thickness of the main portion of the bus line for the gate can be increased and the electrical resistance of the bus line can be reduced. Furthermore, the layer thickness of the gate electrode can be reduced and reverse stagger TFT can be made in the laminated structure on the covered condition with no difference in level.

According to the method disclosed in the publication, there are several problems which will be described as follows.

(1) Since resist work must be conducted many times, the manufacturing process becomes complicated. To go into more detail, the following resist works are needed. One is the resist work to remain a narrow resistant layer on the bus line for the gate. The other is the resist work to remove a prescribed amount from both the bare upper portion of the bus line for the gate and the upper portion of the gate electrode by the anisotropic dry etching method.

(2) Since a narrow resistant layer is left on the bus line for the gate by over-exposing, controlling the overexposure is difficult. Accordingly, the shape of the bus line with a stepped formation, is apt to fluctuate and the reliability is decreased.

(3) Since a prescribed amount is removed from both the bare upper portion of the bus line for the gate and the upper portion of the gate electrode by the anisotropic dry etching method in order to obtain a thin layer, it is difficult to obtain a prescribed thin layer and the characteristics of the reverse stagger TFT fluctuates. As a result, the reliability is decreased.

(4) As the bus line for the gate and the gate electrode are combined into one unit, they must be made from the same material. For that reason, the bus line for the gate and the gate electrode can not be made from adequate materials.

SUMMARY OF THE INVENTION

In view of the foregoing, it is the object of this invention to provide a liquid crystal display device and its manufacturing method, the details of which will be explained as follows.

(1) It is an object of the invention to provide a liquid crystal display device in which a wide display screen composed of fine dots is installed by reducing the electrical resistance of the bus line, and in which an active element of the laminated structure on the covered condition with no level difference is formed by making the electrode on the transparent side of the active elements.

(2) It is another object of the invention to provide a liquid crystal display device manufacturing method by which a reliable bus line and active element can be formed with less resist work and furthermore by a simple process, and by which the electrical resistance of the bus line can be reduced and the electrode of the active element on the transparent substrate side can be made thin.

The characteristics of the liquid crystal display device of the present invention will be described as follows. In the liquid crystal display device, which has transparent pixel electrodes installed on a transparent substrate in the form of a matrix, active elements with a laminated structure for the switching function each of which is installed corresponding to each pixel electrode, and a bus line between the pixel electrodes, the bus line comprises at least: a transparent conductive layer formed on the transparent substrate; a first wiring layer provided on the transparent conductive layer; and a second wiring layer provided on the first wiring layer, wherein a portion of the second wiring layer is laid on the transparent substrate and a portion of the second wiring layer is used as the electrode of the active element on the transparent substrate side.

The manufacturing method of the above-described liquid crystal display device is characterized by comprising the following manufacturing processes (1) to (5).

Process (1): A transparent conductive layer is formed on one side of a transparent substrate. Furthermore, the first wiring layer is laid on the transparent conductive layer.

Process (2): Patterning is conducted on the laminated layer consisting of the transparent conductive layer and the first wiring layer formed in Process (1) according to the pattern to form the bus line and the pixel electrode.

Process (3): The second wiring layer is laid on the laminated layer consisting of the transparent conductive layer and the first wiring layer on which the patterning was conducted in Process (2) and on the transparent substrate.

Process (4): Patterning is conducted on the second wiring layer formed in Process (3) according to the pattern to form the bus line and the electrode of the active element.

Process (5): The unnecessary portion of the first wiring layer is removed according to the same pattern as that in Process (4).

According to the present invention, the bus line is formed from the laminated layer comprising at least the transparent conductive layer, the first wiring layer, and the second wiring layer. Accordingly, the electrical resistance of the bus line is reduced by increasing the thickness of the first wiring layer and decreasing the electrical resistance of the first wiring layer. Furthermore, a portion of the second wiring layer is laid on the transparent substrate and the portion is used as the electrode of the active element on the transparent substrate side. For that reason, an active element with no level difference in the laminated structure on the covered condition, can be formed by reducing the thickness of the second wiring layer.

Therefore, the device of the invention can meet the requirements of obtaining a wide display screen composed of fine dots. Furthermore, a reliable active element without defects such as a short-circuit and a decrease in withstanding voltage, can be formed by reducing the thickness of the electrode of the active element on the transparent substrate side.

Since the bus line has a laminated structure, the materials of the first wiring layer and the second wiring layer can be independently determined. Consequently, the first wiring layer can be composed of materials with low electrical resistance and the second wiring layer can be composed of materials adequate for the electrode of the active element to improve the efficiency of the bus line and the active element.

Adhesion of the bus line to the transparent substrate can be improved by providing the transparent conductive layer on the substrate.

According to the present invention, the transparent conductive layer, the first wiring layer, and the second wiring layer can be formed by conventional layer forming methods. Accordingly, the layer thickness can be controlled easily and the thickness of the electrode of the active element on the transparent substrate side can be reduced and controlled to be uniformly thick, with high accuracy.

Concerning the patterning conducted on the laminated layer of the transparent conductive layer and the first wiring layer and the patterning on the second wiring layer, since the unnecessary portion of the first wiring layer is removed at Process (5) by the same pattern as that in Process (4), patterning for three layers with different patterns can be conducted by using two masks and carrying out the resist work twice. In other words, the electrical resistance of the bus line can be reduced and at the same time the thickness of the electrode of the active element on the transparent substrate side can be decreased without increasing the number of masks and the resist work.

In Process (3), the second wiring layer is laid on the laminated layer consisting of the transparent conductive layer and the first wiring layer on which patterning was conducted in Process (2), and on the transparent substrate. Therefore, materials suitable to reduce the electrical resistance can be selected for the first wiring layer, and materials suitable for the electrode of the active element on the transparent substrate side can be selected for the second wiring layer. Accordingly, the efficiency of the bus line and the active element can be improved.

BRIEF DESCRIPTION OF THE DRAWINGS

FIGS. 1-(a), 2-(a), 3-(a), and 4-(a) are the top plan views. FIGS. 1-(b), 2-(b), 3-(b), and 4-(b) are enlarged end views taken on line A—A of FIGS. 1-(a), 2-(a), 3-(a), and 4-(a). FIGS. 1-(c), 2-(c), 3-(c), and 4-(c) are enlarged end views taken on line B—B of FIGS. 1-(a), 2-(a), 3-(a), and 4-(a). FIGS. 1-(d), 2-(d), 3-(d), and 4-(d) are enlarged end views taken on line C—C of FIGS. 1-(a), 2-(a), 3-(a), and 4-(a).

FIG. 5, FIGS. 6-(a), 6-(b), FIGS. 7, FIG. 8-(a), 8-(b), and FIG. 9 are schematic illustrations which show the manufacturing processes of Example 5 in order. FIGS. 5, 7, and 9 are end views. FIGS. 6-(a) and 8-(a) are top plan views. FIGS. 6-(b) and 8-(b) are enlarged end views taken on line A—A of FIGS. 6-(a) and 8-(a). FIGS. 10-(a) and 11-(a) are top plan views. FIGS. 10-(b) and 11-(b) are enlarged end views taken on line A—A of FIGS. 10-(a) and 11-(a).

FIG. 12-(a) is a top plan view. FIG. 12-(b) is an enlarged end view taken on line A—A of FIG. 12-(a). FIG. 12-(c) is an enlarged end view taken on line B—B of FIG. 12-(a).

DETAILED DESCRIPTION OF THE INVENTION

Figure 1B:
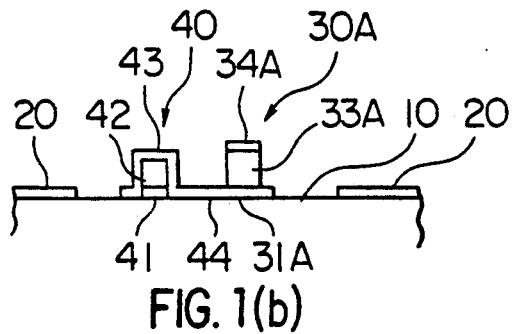
FIGS. 1-(a), 1-(b), 1-(c), 1-(d), FIGS. 2-(a), 2-(b), 2-(c), FIGS. 3-(a), 3-(b), 3-(c), FIGS. 4-(a), 4-(b), and 4-(c) are schematic illustrations which show the main portions of the liquid crystal display device of Examples 1, 2, 3, and 4.
Figure 1C:
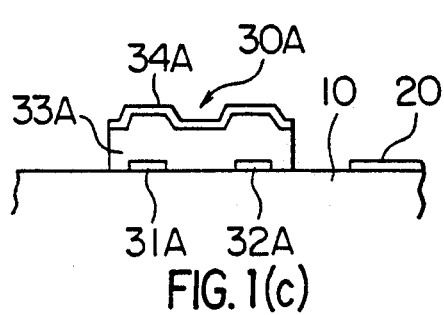
Figure 1D:
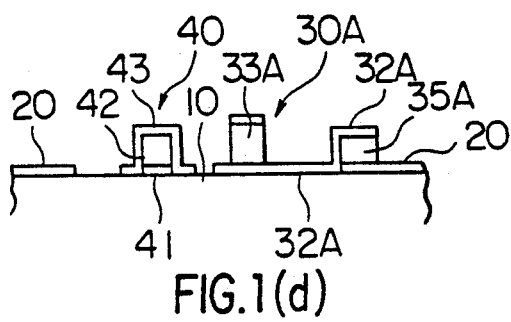
Figure 1A:
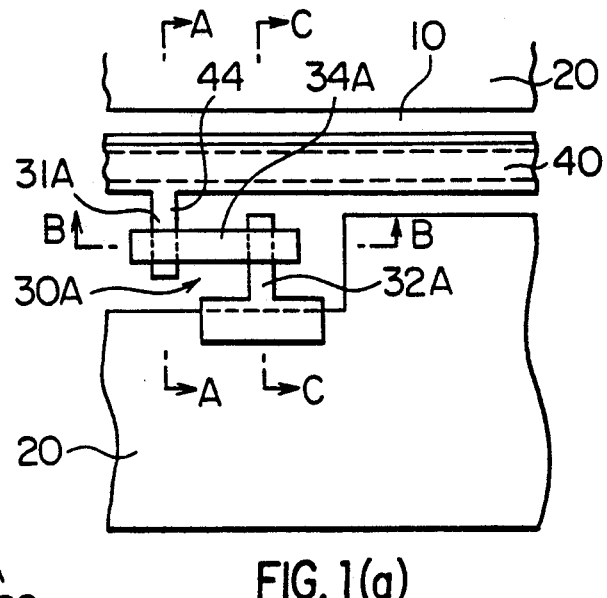

Referring to the drawings, the examples of the present invention will be explained below.

EXAMPLE 1

In this example, a back-to-back Schottky diode is used as the active element.

FIGS. 1-(a), 1-(b), 1-(c), and 1-(d) show the main portion of the liquid crystal display device of this example. FIG. 1-(a) is a top plan view. FIG. 1-(b) is an end view taken on line A—A of FIG. 1-(a). FIG. 1-(c) is an end view taken on line B—B of FIG. 1-(a). FIG. 1-(d) is an enlarged end view taken on line C—C of FIG. 1-(a).

The numeral 10 is a transparent substrate on which the transparent pixel electrodes 20 are placed in the form of a matrix.

The numeral 30A is an active element composed of a back-to-back Schottky diode with a laminated structure for the switching function. The active element 30A is provided corresponding to the pixel electrode 20.

The numeral 40 is a bus line which is placed between the pixel electrodes 20. This bus line 40 is composed of; the transparent conductive layer 41 formed on the transparent substrate 10; the first wiring layer 42 which is laid on the transparent conductive layer 41, the first wiring layer 42 being thick and having low electrical resistance; and the second wiring layer 43 which is laid on the first wiring layer 42, the second wiring layer 43 being thin and conductive.

A portion of the second wiring layer 43 which is thin and conductive, extends to the active element 30A and is laid on the transparent substrate 10. The extended portion 44 is used as the electrode 31A of the active element 30A on the transparent substrate side.

In the active element 30A which is composed of a back-to-back Schottky diode, the numeral 32A is another electrode, the numeral 33A is a semiconductor layer, and the numeral 34A is a common electrode. Another electrode 32A is electrically connected with the pixel electrode 20 through the middle layer 35A which is made from the same material and formed in the same patterning process as that of the first wiring layer 42.

Since the electrical resistance of the bus line 40 can be satisfactorily reduced by the first wiring layer 42, the metals suitable for forming a Schottky barrier can be selected for the material of the second wiring layer 43. Accordingly, a back-to-back Schottky diode with excellent switching characteristics can be formed.

Palladium, platinum, nickel, chrome, and nickel-chrome can be used as the material of the second wiring layer. Amorphous silicone (a - Si:H) can be used as the material for the semiconductor layer 33A.

EXAMPLE 2

In this example, MIM (metal insulator metal) is used as the material for an active element. The details of the example will be explained as follows.

Figure 2B:
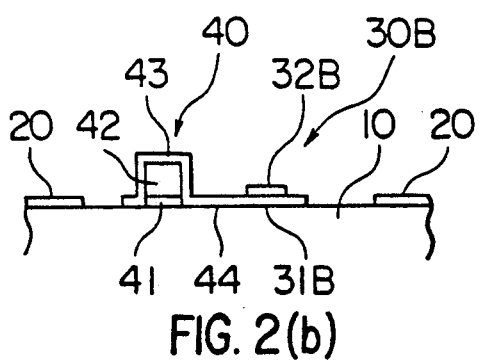
Figure 2C:
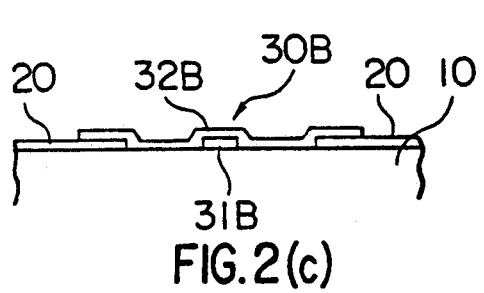
Figure 2A:
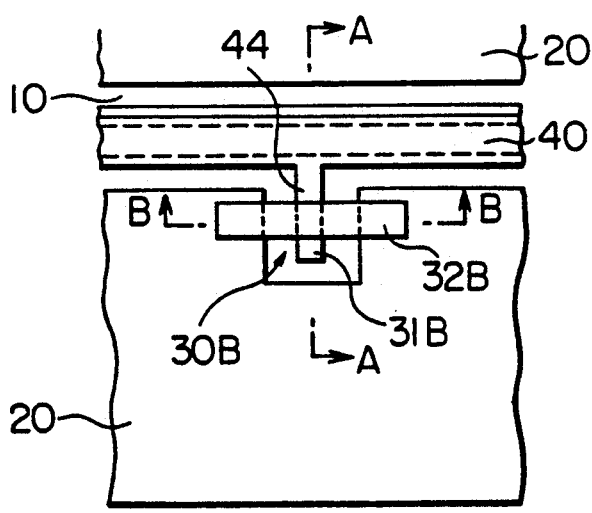

FIGS. 2-(a), 2-(b), and 2-(c) illustrate the main portion of the liquid crystal display device of the example. FIG. 2-(a) is a top plan view. FIG. 2-(b) is an enlarged end view taken on line A—A of FIG. 2-(a). FIG. 2-(c) is an enlarged end view taken on line B—B of FIG. 2-(a). The structure of the bus line 40 is the same as that in Example 1.

The numeral 30B is an active element made from MIM. The extended portion 44 of the second wiring layer 43 which is thin and conductive and constitutes the bus line 40, is used as the electrode 31B of the active element 30B on the transparent substrate side. An insulating layer composed of oxide which was produced by oxidation treatment, is formed on the surface of the second wiring layer 43. The numeral 32B is a metal layer which is connected with the pixel electrode 20.

Metals suitable for the MIM electrode can be selected for the material of the second wiring layer 43. Therefore, MIM with excellent switching characteristics can be constituted.

EXAMPLE 3

In this example, a reverse stagger TFT (thin film transistor) is used as an active element.

FIGS. 3-(a), 3-(b), and 3-(c) illustrate the main portion of a liquid crystal display device of the invention. FIG. 3-(a) is a top plan view. FIG. 3-(b) is an enlarged end view taken on line A—A of FIG. 3-(a). FIG. 3-(c) is an enlarged end view taken on line B—B of FIG. 3-(a). The structure of the bus line 40 is the same as that in Example 1. The numeral 30C is an active element composed of a reverse stagger TFT. The extended portion 44 of the thin conductive second wiring layer 43 which forms the bus line 40, is used as the electrode (the gate electrode) 31C of the active element 30C on the transparent substrate side. This bus line 40 is for the gate. The numeral 32C is an insulating layer. The numeral 33C is a semiconductor layer. The numeral 34C is a source electrode. The numeral 35C is a drain electrode. The numeral 36C is a source line. The drain electrode 35C is connected with the pixel electrode 20.

Metals suitable for the gate electrode of a reverse stagger TFT can be selected for the second wiring layer 43. Accordingly, a reverse stagger TFT with excellent switching characteristics can be formed.

EXAMPLE 4

In this example, a normal stagger TFT is used as an active element.

FIGS. 4-(a), 4-(b), and 4-(c) illustrate the main portion of a liquid crystal display device of the invention. FIG. 4-(a) is a top plan view. FIG. 4-(b) is an enlarged end view taken on line A—A of FIG. 4-(a). FIG. 4-(c) is an enlarged end view taken on line B—B of FIG. 4-(a). The structure of the bus line is the same as that in Example 1.

The numeral 30D is an active element consisting of a normal stagger TFT. The extended portion 44 of the thin conductive second wiring layer 43 which forms the bus line 40, is used as the electrode (the source electrode) 31D of the active element 30D on the transparent substrate side. This bus line 40 is for the source. The numeral 32D is a semiconductor layer. The numeral 33D is an insulating layer. The numeral 34D is a gate electrode. The numeral 35D is a drain electrode. The numeral 36D is a gate line. The drain electrode 35D is electrically connected with the pixel electrode through the middle layer 37D which was made from the same material and formed in the same patterning process as that of the first wiring layer 42.

Metals suitable for the source electrode of the normal stagger TFT can be selected for the second wiring layer 43. Accordingly, a normal stagger TFT with excellent switching characteristics can be formed.

According to Examples 1 to 4, the bus line is composed of a laminated layer of the transparent conductive layer 41, the thick first wiring layer 42 with low electrical resistance, and the thin conductive second wiring layer 43. Therefore, the electric resistance of the bus line 40 can be reduced by the thick first wiring layer with low electrical resistance.

Accordingly, even when the bus line becomes long in order to provide a wide display screen composed of fine dots, a voltage drop can be substantially avoided and the switching function can be satisfactorily conducted.

A portion of the thin conductive second wiring layer 43 is extended to the active element 30 and laid on the transparent substrate 10. Furthermore, since the extended portion 44 is used as the electrode (31A, 31B, 31C, and 31D) of the active element 30 on the transparent substrate side, the active element 30 with no level difference in the laminated structure on the covered condition can be formed. As a result, defects such as a short-circuit of the active element 30 and a decrease in withstanding voltage can be prevented.

Since the bus line 40 has a laminated structure, the materials of the first wiring layer 42 and those of the second wiring layer 43 can be selected independently. Accordingly, the first wiring layer 42 can be formed by materials with low electrical resistance and the second wiring layer 43 can be formed by materials which are suitable for the electrode of the active element 30. As a result, the efficiency of the bus line 40 and the active element 30 can be improved.

Adhesion of the bus line to the transparent substrate can be increased by providing the transparent conductive layer.

In the liquid crystal display device of the present invention, either a two terminal element or a three terminal element can be used as an active element.

For a two terminal element, a ring diode, MSI in which SiNx is used, and other non-linear elements such as an $As_2Se_3$ element and a Barister can be used other than MIM and a back-to-back Schottky diode. Concerning the structure of a diode, various kinds of diode structures such as pn, pin, and hetero junction can be used.

Amorphous silicone type TFT, polysilicone type TFT, and CdSe type TFT can be used as a three terminal element other than a normal stagger TFT and a reverse stagger TFT.

Materials with low electrical resistance which are useful to reduce the electrical resistance of the bus line, which can be used for the first wiring layer, are chrome (Cr), aluminum (Al), tantalum (Ta), molybdenum (Mo), palladium (Pd), nickel (Ni), titanium (Ti), copper (Cu), gold (Au), silver (Ag), alloys of these metals, and silicides of these metals. The electrical resistance of the first wiring layer depends on the area of the displaying unit and the pattern of the bus line. It is preferable that the resistance is not higher than 10 $\Omega/\square$, more preferably not higher than 3 $\Omega/\square$. For example, when the first wiring layer is composed of a layer made from chrome (Cr) of 3000 Å (3 $\Omega/\square$) thick and of 20 $\mu$m wide, voltage drop due to the bus line is little and there is no problem in the switching function even when the length of the first wiring layer is 25 cm. Herein, $\Omega/\square$ represents surface resistivity $\Omega/cm^2$.

The materials which are suitable for the electrode on the transparent substrate side are selected for the second wiring layer according to the kind of the active element. In the case of a back-to-back diode, it is preferable that the material is selected from the following: palladium (Pd), platinum (Pt), nickel (Ni), chrome (Cr), nickel-chrome (Ni-Cr), and molybdenum (Mo). In the case of MIM, it is preferable that the material is selected from the following: tantalum (Ta), aluminum (Al), chrome (Cr), nickel (Ni), copper (Cu), and gold (Au). In case of a reverse stagger TFT gate electrode, it is preferable that the material is selected from the following: tantalum (Ta), molybdenum (Mo), molybdenum-tantalum (Mo-Ta), chrome (Cr), aluminum (Al), and titanium (Ti). In case of a normal stagger TFT source electrode, it is preferable that the material is selected from the following: chrome (Cr), titanium (Ti), aluminum (Al), molybdenum (Mo), chrome-aluminum (Cr-Al), and molybdenum-aluminum (Mo-Al). Alloys and silicides of these metals can be used.

It is necessary for the second wiring layer to be extended along the bus line, wherein the second wiring layer covers at least a portion of the first wiring layer. Accordingly, it is not necessary for the second wiring layer to completely cover the first wiring layer.

The thickness of the second wiring layer is preferably not larger than 1000 Å, more preferably 100 to 500 Å. When the thickness of the second wiring layer is in this range, it can be composed of a multilayer structure.

Fused quartz, borosilicate glass, '7059 Glass' manufactured by Corning Co., and 'Tempax Glass' manufactured by Jena Co. can be preferably used as the materials of the transparent substrate.

Hereinafter, examples of manufacturing methods according to the invention will be explained.

EXAMPLE 5

In this example, the electrode of the active element on the transparent substrate side was formed by Processes (1) through (5), wherein the electrode is composed of the bus line, the pixel electrode, and a reverse stagger amorphous silicone type TFT.

Process (1)

As shown in FIG. 5, the transparent conductive layer 60, composed of a 1000 Å thick ITO layer, was formed by the spattering method on the transparent substrate 10, made from glass. Furthermore, the first wiring layer 70, composed of a 3000 Å thick chrome layer, was laid on the transparent conductive layer 60 by the continuous spattering method.

Process (2)

Patterning was conducted on the laminated layers, composed of the transparent conductive layer 60 and the first wiring layer 70, by applying both the chrome wet etching method and the ITO wet etching method continuously, according to the pattern to form the bus line and the pixel electrode. FIGS. 6-(a) and 6-(b) show the condition after patterning has been conducted. The numeral 60A is the transparent conductive layer on which patterning has been conducted. The numeral 70A is the first wiring layer on which patterning has been conducted.

Process (3)

The second wiring layer 80, composed of a 1000 Å thick tantalum layer, was laid both on the laminated layers, which consist of the transparent conductive layer 60A and the first wiring layer 70A, and on the bare portion of the transparent substrate. FIG. 7 illustrates the condition after Process (3) has been completed.

Process (4)

Patterning was conducted on the second wiring layer 80 by applying the chemical dry etching method, according to the pattern, to form the bus line and the electrode of the active element. FIGS. 8-(a) and 8-(b) illustrate the condition after patterning has been conducted. The numeral 80A is the second wiring layer on which patterning has been conducted.

Process (5)

The unnecessary portion of the first wiring layer 70A was removed according to the same pattern as Process (4). To explain in the more concrete form, the chrome wet etching method was applied.

Figure 9:
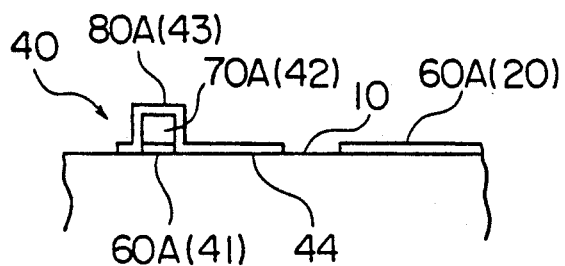

FIG. 9 illustrates the condition after Process (5) was completed.

After the bus line 40, which is composed of the transparent conductive layer 41, the first wiring layer 42, and the second wiring layer 43, the pixel electrode 20, and the gate electrode 31C of a reverse stagger TFT, were formed by Processes (1) through (5), a liquid crystal display device with the same structure as shown in FIGS. 3-(a), 3-(b), and 3-(c), were manufactured according to the common reverse stagger TFT manufacturing process. The insulating layer 32C is composed of a 3000 Å thick SiNx layer. The semiconductor layer 33C is composed of a 3000 Å thick a-Si:H layer. The source electrode 34C and the drain electrode 35C are composed of a 3000 Å thick chrome layer.

EXAMPLE 6

In this example, the electrode of an active element on the transparent substrate side was formed by the following Processes 1 through 5, wherein the electrode is composed of the bus line, the pixel electrode, and MIM.

Process (1)

A laminated layer composed of the transparent conductive layer 60 and the first wiring layer 70 was formed on the transparent substrate 10 in the same way as that in Example 5.

Process (2)

Figure 10B:
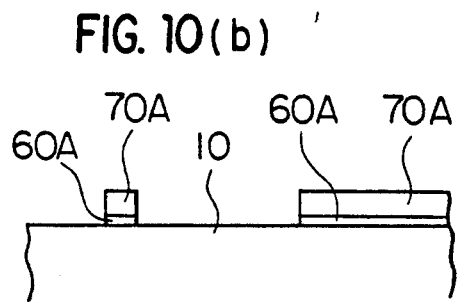
FIGS. 10-(a), 10-(b), FIGS. 11-(a), and 11-(b) are schematic illustrations which show the manufacturing processes of Example 6 in order.
Figure 10A:
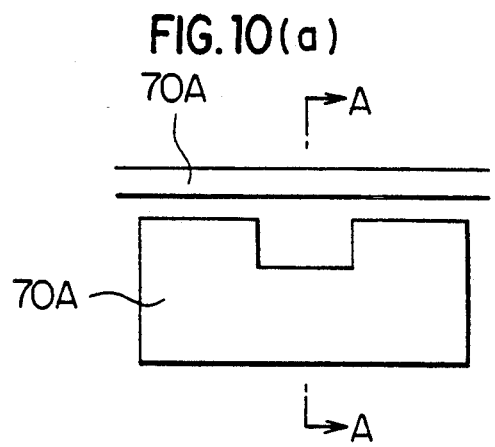

Patterning was conducted by the pattern to form the bus line and the pixel electrode, on the laminated layer which was formed from the transparent conductive layer 60 and the first wiring layer 70 in Process (1), in the same way as that in Example 5. FIGS. 10-(a) and 10-(b) show the conditions of the layers after patterning have been conducted.

Process (3)

The second wiring layer 80 made of a 1000 Å thick tantalum (Ta) layer, was laid by the spattering method both on the laminated layer composed of the transparent conductive layer 60A and the first wiring layer 70A, and on the bare portion of the transparent substrate 10.

Process (4)

Chemical dry etching was conducted for patterning on the second wiring layer 80 by the pattern to form the bus line and the electrode of the active element. Oxidation was conducted on the surface of this second wiring layer 80 in order to change the 500 Å thick surface to an insulating layer of an oxide ($Ta_2O_5$).

Process (5)

Figure 11B:
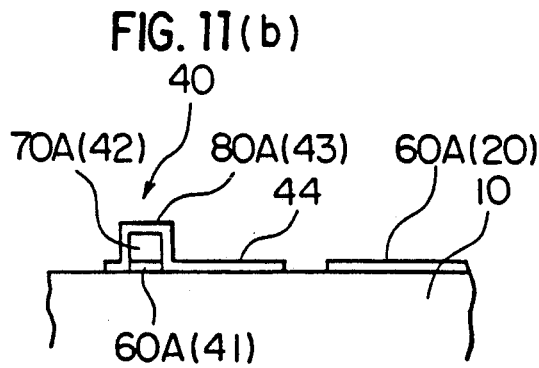
Figure 11A:
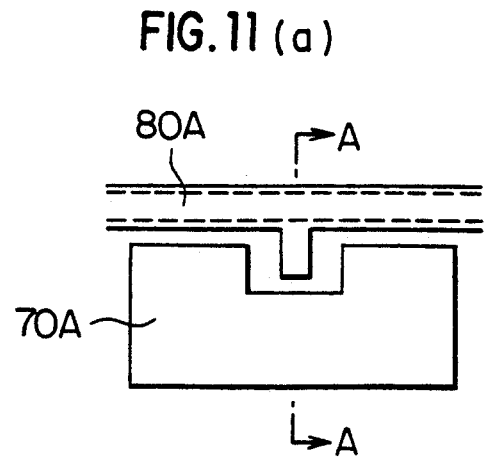

An unnecessary portion of the first wiring layer 70A was removed according to the same pattern as that in Process (4) in the same way as Example 5. FIGS. 11-(a) and 11-(b) show the condition of layers after patterning was conducted. The numeral 80A shows the second wiring layer after patterning has been conducted.

The bus line 40 composed of the transparent conductive layer 41, the first wiring layer 42 and the second wiring layer 43, the pixel electrode 20, and one of the electrodes 31B of MIM, were formed through Processes (1) through (5). After that, the liquid display device with the same structure as that shown in FIGS. 2-(a), 2-(b), and 2-(c) was manufactured according to the common MIM manufacturing process. The metal layer 32B was composed of a chrome (Cr) layer 1000 Å thick.

EXAMPLE 7

In this Example, the electrode of the active element on the transparent substrate side was formed through the following Processes (1) through (5), wherein the electrode was composed of a bus line, a pixel electrode, and a back-to-back Schottky diode.

Process (1)

A laminated layer composed of the transparent conductive layer 60 and the first wiring layer 70, was formed on the transparent substrate 10 in the same way as that in Example 5.

Process (2)

Patterning was conducted by the pattern to form the bus line and the pixel electrode on the laminated layer composed of the transparent conductive layer 60 and the first wiring layer 70 in the same way as that in Example 5.

Process (3)

The second wiring layer 80 composed of a palladium (Pd) layer 500 Å thick was laid by the spattering method both on the laminated layer composed of the transparent conductive layer 60A and the first wiring layer 70A, and on a bare portion of the transparent substrate 10.

Process (4)

Patterning was conducted on the second wiring layer 80 by the wet etching method according to the pattern to form the bus line and the electrode of the active element.

Process (5)

Figure 12A:
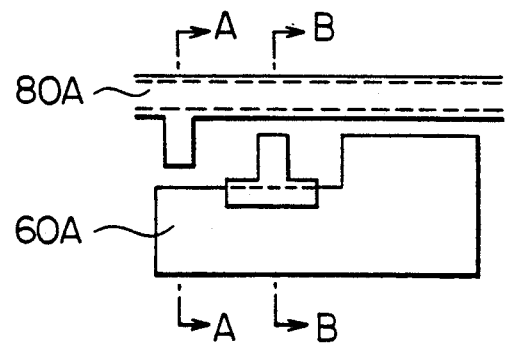
FIGS. 12-(a), 12-(b), and 12-(c) are schematic illustrations which show the manufacturing processes of Example 7.
Figure 12B:
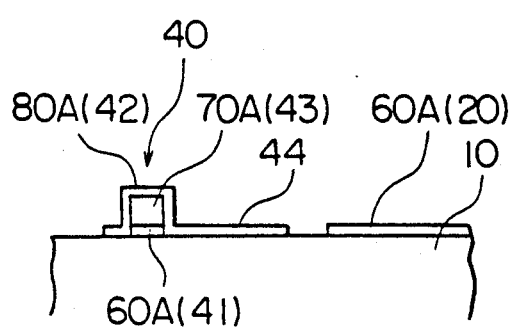
Figure 12C:
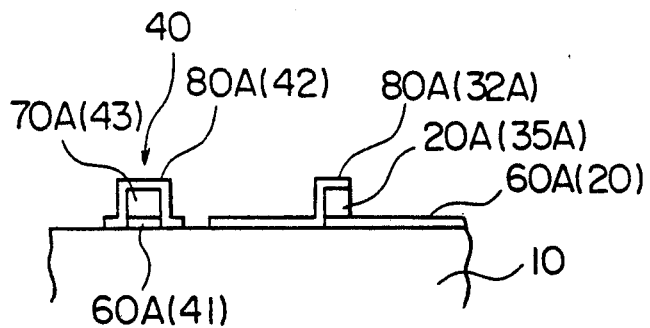

An unnecessary portion of the first wiring layer 70A was removed according to the same pattern as Process (4) in the same way as that in Example 5. FIGS. 12-(a), 12-(b), and 12-(c) show the condition of the layers after Process (5) has been completed. The numeral 80A is the second wiring layer on which patterning has been conducted.

The bus line 40 composed of the transparent conductive layer 41, the first wiring layer 42 and the second wiring layer 43, the pixel electrode 20, and the electrodes 31A and 32A to form the Schottky barrier of the back-to-back Schottky diode, are formed through Processes (1) through (5). After that, a liquid crystal display device with the same structure as that shown in FIGS. 1-(a), 1-(b), and 1-(c) was manufactured according to the manufacturing process of the back-to-back Schottky diode.

The semiconductor layer 33A was composed of a a-Si:H layer 1 μmm thick. The common electrode 34A was composed of a chrome layer 1000 Å thick. The middle layer 35A was formed from the same material and in the same patterning process as those of the first wiring layer 42.

According to Examples 5 to 7, the transparent conductive layer 60, the first wiring layer 70, and the second wiring layer 80 can be formed by a common layer forming method. Therefore, the layer thickness can be easily controlled. As a result, the electrodes 31A, 31B, and 31C of the active element 30 on the transparent substrate 10 side can be made a thin layer of a uniform and highly accurate thickness.

Concerning the patterning both of the laminated layer composed of the transparent conductive layer 60 and the first wiring layer 70 and of the second wiring layer 80, an unnecessary portion of the first wiring layer 70A is removed at Process (5) according to the same pattern as that of Process (4). Consequently, patterning can be carried out on three layers with different patterns by two masks and by conducting resist work twice. In other words, the electrical resistance of the bus line 40 can be reduced and the thickness of the electrode of the active element 30 on the transparent substrate 10 side can be also reduced without increasing the number of masks and the resist work.

In Process (3), both on the laminated layer composed of the transparent conductive layer 60A and the first wiring layer 70A on which patterning has been conducted and on the transparent substrate 10 the second wiring layer 80 is laid. Accordingly, the material suitable for reducing the electrical resistance of the bus line 40 can be used as the material to form the first wiring layer 70. The material suitable for the electrode of the active element 40 on the transparent substrate 10 side can be used as the material to form the second wiring layer 80. As a result, the efficiency of the bus line 40 and the active element 30 can be improved.

According to the invention, the electrical resistance of the bus line can be reduced by the first wiring layer. Accordingly, the device of the invention can meet the demand for a liquid crystal display device with a wide display screen composed of fine dots. The thickness of the electrode of the active element can be reduced by the second wiring layer. Therefore, a highly reliable active element with no level difference in the laminated structure on the covered condition which does not have defects such as short-circuits and decreases of withstanding voltage, can be obtained.

According to the invention, the electrical resistance of the bus line can be reduced and the thickness of the electrode of the active element on the transparent substrate side can be reduced by a simple process, with less masks and resist work.

What is claimed is:

1. A liquid crystal display device, comprising:
   a transparent substrate;
   transparent pixel electrodes arranged in matrix form on said transparent substrate;
   active elements provided to each of said pixel electrodes for switching said pixel electrodes; and
   a bus line, provided among said pixel electrodes and comprising at least three layers including a transparent conductive layer provided on said transparent substrate as the lower most layer among said at least three layers, a first wiring layer, and a second wiring layer, said second wiring layer having a branch portion extending to said active elements, said branch portion being an electrode for said active elements.

2. The device of claim 1, wherein said active elements are selected from the group consisting of two terminal elements and three terminal elements.

3. The device of claim 2, wherein said elements are two terminal elements which are selected from the group consisting of MIM, back-to-back Shottky diode, ring diode, MSI and non-linear elements.

4. The device of claim 3, wherein said active elements are non-linear elements which are selected from the group consisting of $AS_2Se_3$ and Barister elements.

5. The device of claim 3, wherein said active elements are diodes which are selected from the group consisting of pn junction, pin junction, and hetero junction structures.

6. The device of claim 2, wherein said active elements are three terminal elements which are selected from the group consisting of normal stagger TFT, reverse stagger TFT, amorphous silicon type TFT, polysilicon type TFT, and CdSe type TFT elements.

7. The device of claim 1, wherein said first wiring layer is selected from the group consisting of chrome, aluminum, tantalum, molybdenum, palladium, nickel, titanium, copper, gold, and silver.

8. The device of claim 1, wherein the electrical resistance of said first wiring layer is not higher than 10 Ω/□.

9. The device of claim 1, wherein, when said active elements are back-to-back Shottky diodes, and said second wiring layer is selected from the group consisting of palladium, platinum, nickel, chrome, nickel-chrome, and molybdenum.

10. The device of claim 1, wherein, said active elements are MIM, and said second siring layer is selected from the group consisting of tantalum, aluminum, chrome, nickel, copper and gold.

11. The device of claim 1, wherein said active elements are reverse stagger TFT, and said second wiring layer is selected from the group consisting of tantalum, molybdenum, molybdenum-tantalum, chrome, aluminum, and titanium.

12. The device of claim 1, wherein said active elements are normal stagger TFT, and said second wiring layer is selected from the group consisting of chrome, titanium, aluminum, molybdenum, chrome-aluminum, and molybdenum-aluminum.

13. The device of claim 1, wherein the thickness of said second wiring layer is not thicker than 1000 Å.

14. The device of claim 13, wherein the thickness of said second wiring layer is 100 to 500 Å.

15. The device of claim 1, wherein said first wiring layer is superimposed on said transparent conductive layer and said second wiring layer is superimposed on said first wiring layer.

16. The device of claim 15, wherein said branch line has a portion that contacts said transparent substrate.

17. A liquid crystal display device, comprising:
a transparent substrate;
transparent pixels electrodes arranged in matrix form on said transparent substrate;
active elements provided to each of said pixel electrodes, for switching said pixel electrodes, and
a bus line provided among said pixel electrodes and comprising at least three layers including a transparent conductive layer, a first wiring layer and a second wiring layer,
said transparent conductive layer formed on said transparent substrate as the lowermost layer among said three layers;
said first wiring layer disposed on said transparent conductive layer and having the lowest electrical resistance among said three layers; and
said second wiring layer disposed on said transparent conductive layer and having a branch line extending from said bus line to said active elements which serves as electrode to said active elements.

* * * * *

UNITED STATES PATENT AND TRADEMARK OFFICE
CERTIFICATE OF CORRECTION

PATENT NO. : 5,107,355

DATED : April 21, 1992

INVENTOR(S) : TAXAY SATOH et al.

It is certified that error appears in the above-identified patent and that said Letters Patent is hereby corrected as shown below:

Claim 10, column 12, line 56, change "siring" to --wiring--.

Signed and Sealed this

Fifth Day of October, 1993

Attest:

BRUCE LEHMAN

Attesting Officer

Commissioner of Patents and Trademarks